United States Patent
Mittermaier et al.

(10) Patent No.: US 6,435,797 B1
(45) Date of Patent: Aug. 20, 2002

(54) METHOD AND DEVICE FOR LOADING A SUSCEPTOR

(75) Inventors: Herbert Mittermaier, Rattenkirchen; Georg Brenninger, Oberbergkirchen; Alois Aigner, Marktl, all of (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/694,867

(22) Filed: Oct. 24, 2000

(30) Foreign Application Priority Data

Oct. 28, 1999 (DE) .......................................... 199 51 991

(51) Int. Cl.⁷ .......................... B65G 49/07; C23C 16/00
(52) U.S. Cl. ...................... 414/180; 414/160; 414/804; 414/935; 118/725; 118/729
(58) Field of Search ................................ 414/180, 160, 414/935, 804; 118/729, 725

(56) References Cited

U.S. PATENT DOCUMENTS

| | | |
|---|---|---|
| 3,973,665 A | 8/1976 | Giammanco |
| 5,421,893 A | 6/1995 | Perlov |
| 5,444,217 A * | 8/1995 | Moore et al. ................ 219/405 |
| 6,231,716 B1 * | 5/2001 | White et al. ................ 156/345 |
| 6,293,749 B1 * | 9/2001 | Raaijmakers et al. ....... 414/609 |

FOREIGN PATENT DOCUMENTS

DE    4235676    6/1994

OTHER PUBLICATIONS

English Derwent Abstract AN 1994–192333 [24] corresp. to DE4235676.

* cited by examiner

Primary Examiner—Steven A. Bratlie
(74) Attorney, Agent, or Firm—Collard & Roe, P.C.

(57) ABSTRACT

A method is provided for loading a heated susceptor or a susceptor segment of a deposition reactor with a substrate wafer which is resting on a holding means. Before making contact between the substrate wafer and the susceptor or susceptor segment, a holding position is reached in which the substrate wafer and the susceptor or susceptor segment are at a spaced vertical distance from one another. The substrate wafer is only brought into contact with the susceptor or the susceptor segment after a residence time in this holding position. There is also a device for loading a susceptor, in particular a susceptor segment of a deposition reactor.

14 Claims, 1 Drawing Sheet

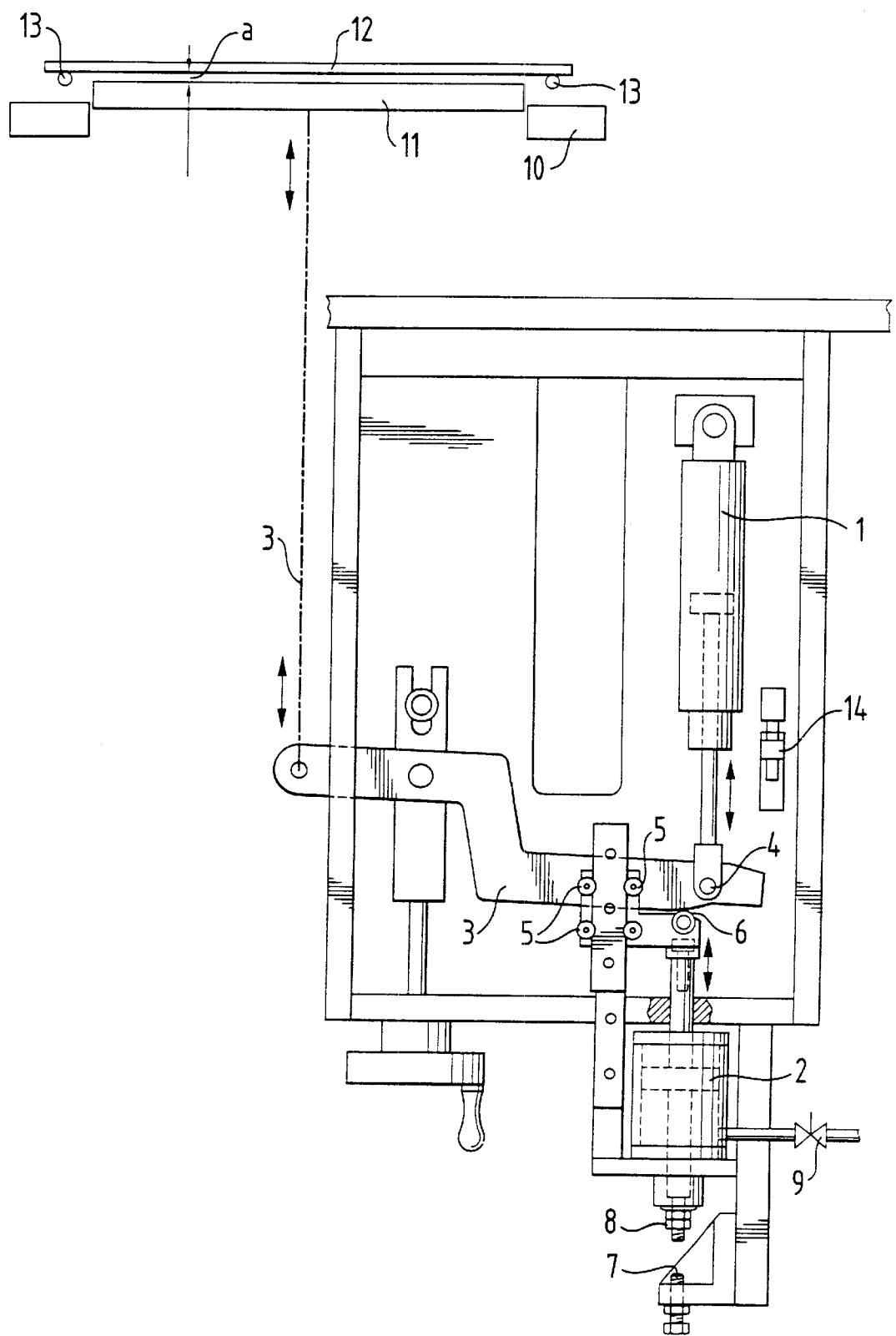

METHOD AND DEVICE FOR LOADING A SUSCEPTOR

BACKGROUND OF THE INVENTION

1. Field of the Invention

The present invention relates to a method for loading a heated susceptor or a susceptor segment of a deposition reactor with a substrate wafer which is resting on a holding device. The invention also relates to a device for loading a susceptor, in particular, a susceptor segment of a deposition reactor.

2. The Prior Art

Deposition reactors which are used in particular in the semiconductor industry for depositing an epitaxial layer on a substrate wafer are described in the prior art.

During all the coating and/or deposition processes, one or more substrate wafers are heated by means of heating sources, preferably by means of upper and lower heating sources. Examples of these heating sources include, lamps or banks of lamps. These wafers are then exposed to a gas mixture consisting of a source gas, a carrier gas and, if appropriate, a doping gas.

A susceptor, for example made from graphite, SiC or quartz in the deposition chamber of the deposition reactor, is used as a base for the substrate wafer. During the deposition process, the wafer rests on the susceptor or in milled-out sections in the susceptor. This is done in order to ensure uniform heating and to protect the rear side of the wafer, on which generally no layer is deposited, from the source gas. According to the prior art, the deposition chambers are designed for one or more substrate wafers. Due to the high thermal mass of the susceptor, the susceptor only cools down slowly after the coating of the wafer, even if the heating output is reduced to zero.

To achieve an economic throughput, the susceptor is unloaded immediately after the deposition process and is then loaded with a substrate wafer which is to be coated. The loading and unloading of the susceptor of a deposition reactor with a substrate wafer is preferably automated. During loading, a conveyor and holding device supplies a substrate wafer which is to be coated. The conveyor device is arranged outside the deposition chamber. The substrate wafer rests on the end of the holding device which is, for example, in the form of a fork, for example of a tuning fork. The conveyor device places the holding device and the substrate wafer resting on it vertically above the susceptor of the deposition reactor.

In the prior art, various methods and devices are used to lift the substrate wafer off the holding device and to load the susceptor. By way of example, pins, for example made from quartz, which are guided upward in holes in the susceptor, lift the substrate wafer off the holding device. After the holding device has been retracted from the vertical position, the susceptor is loaded as a result of the pins being guided back into the holes in the susceptor as described in U.S. Pat. No. 5,421,893.

As an alternative to the quartz pins, it is also possible for a vertically movable susceptor segment of a segmented susceptor to lift the substrate wafer off the holding device. To this end, the segment is guided upward until the substrate wafer has been lifted off the holding device. Then, the holding device is retracted from the vertical position and the susceptor is loaded with the substrate wafer as a result of the segment being guided back.

During loading and unloading, the temperature of the susceptor or the susceptor segment is between 300° C. and 1600° C., while the temperature of the substrate wafer is significantly lower than the susceptor temperature. If the substrate wafer is brought into contact with the heated susceptor or the heated susceptor segment according to the prior art, the substrate wafer experiences a thermal stress situation which can lead to the substrate wafer breaking. In particular, contact with a heated susceptor segment leads to the wafer breaking as a result of the partial heating of the substrate wafer.

SUMMARY OF THE INVENTION

It is therefore an object of the present invention to provide a method and a device which permit a heated susceptor or susceptor segment of a deposition reactor to be loaded with a substrate wafer without the substrate wafer being subjected to a thermal stress situation.

The above object is achieved according to the invention by a method for loading a heated susceptor or a susceptor segment of a deposition reactor with a substrate wafer which comprises resting the substrate wafer on a holding means; and before contact between the substrate wafer and the susceptor or susceptor segment causing the substrate wafer and the susceptor or susceptor segment to reach a holding position at a spaced vertical distance from one another; and after a residence time in this holding position is the substrate wafer only then brought into contact with the susceptor or the susceptor segment.

According to the invention, for loading purposes, firstly the holding means and the substrate wafer resting on it are positioned vertically a spaced distance above the heated susceptor of a deposition reactor. Then, the substrate wafer is lifted off the holding means, for example by means of pins, preferably by means of quartz pins. These pins are guided upward, and the holding means is retracted from the vertical position. Then, the pins are guided back into the holes in the susceptor to a position in which the substrate wafer and susceptor are still just at a distance spaced from one another. The substrate wafer is held in this position for a period of from 0.1 to 100 seconds, preferably from 1 to 10 seconds. In this holding position, the substrate wafer and the susceptor are at a distance of from 0.1 to 100 mm, preferably 1 to 10 mm spaced, from one another. This will ensure a uniform heating of the substrate wafer by the heated susceptor. Thus the substrate wafer is not subjected to a thermal stress situation. After the residence time in this holding position referred to above, the substrate wafer is brought into contact with the susceptor as a result of the pins being completely retracted into the holes in the susceptor. Then the substrate wafer can be subjected to a deposition process in the deposition reactor.

In a preferred embodiment of the method according to the invention, for loading purposes firstly the holding means and the substrate wafer resting on it are positioned vertically above a heated, segmented susceptor of a deposition reactor. Then, a vertically movable susceptor segment of the segmented susceptor is moved toward the substrate wafer until a holding position is reached. This position is maintained for a period of from 0.1 to 100 seconds, preferably from 1 to 10 seconds. In this holding position, the substrate wafer and the susceptor segment are at a distance of from 0.1 to 100 mm spaced, preferably 1 to 10 mm, spaced from one another, without contacting each other. This ensures a uniform heating of the substrate wafer by the heated susceptor segment. The substrate wafer is not subjected to a thermal stress situation.

Then, the susceptor segment is guided further upward, with the result that firstly there is contact with the substrate wafer and then a lifting off of the substrate wafer from the holding means is brought about. The holding means is retracted from the vertical position; and the susceptor is loaded with the substrate wafer as a result of the segment being guided back.

The substrate wafer can be made from semiconductor material, such as silicon or germanium.

In addition to the reduced fracture rate achieved as a result of the uniform heating, the method according to the invention is also distinguished by the fact that it is possible to carry out loading at a higher susceptor temperature. This increases the throughput and therefore the economic viability of the deposition reactor.

The preferred embodiment of the method according to the invention is carried out by a device for loading a susceptor or a susceptor segment of a deposition reactor with a substrate wafer which is resting on a holding means, which has a lifting cylinder, which lifts the susceptor or the susceptor segment via a lifting linkage, and a counterpressure cylinder, by means of the which the holding position is set.

Accordingly, the object of the invention is also achieved by means of this device.

BRIEF DESCRIPTION OF THE DRAWINGS

Other objects and features of the present invention will become apparent from the following detailed description considered in connection with the accompanying drawing which discloses an embodiment of the present invention. It should be understood, however, that the drawing is designed for the purpose of illustration only and not as a definition of the limits of the invention.

The FIGURE diagrammatically shows the device according to the invention and in particular, the way in which the lifting cylinder interacts with the counterpressure cylinder.

DETAILED DESCRIPTION OF PREFERRED EMBODIMENTS

Turning now in detail to the drawings, the FIGURE shows how to load a susceptor 10 or a susceptor segment 11 of a deposition reactor with a silicon substrate wafer 12 which is resting on a holding means 13. The counterpressure cylinder 2 of the system is activated and is extended to a set position which is delimited by a delimiting means 8, for example a stop-nut. Shortly afterward, the lifting cylinder 1 moves, lifting the susceptor segment 11 via a lifting linkage 3 until the segment reaches the stop 6 which has been actuated by the counterpressure cylinder 2. Lifting cylinder 1 and lifting linkage 3 are connected to one another, for example by means of bolts 4. This position is maintained for a time which is predetermined by a timer. The counterpressure cylinder 2 is expediently stronger than the lifting cylinder 1, i.e. it preferably generates a greater pressure than the lifting cylinder 1. The stop 14 defines the lower limit position of the susceptor (10 and 11).

In this holding position, substrate wafer 12 and susceptor segment 11 are at a spaced vertical distance "a" spaced from one another. The activation of the counterpressure cylinder 2 is interrupted after the predetermined period. The cylinders are activated, for example, by a liquid, a gas, a motor or carriage; and they are preferably activated by air. The counterpressure cylinder 2 is compressed by the pressure of the cylinder 1. The speed of this operation is set, for example, by means of a valve 9. The result is a gentle sequence of movements between the holding position, the contact with the substrate wafer and lifting off from the holding means. The limit position is adjusted, for example, by means of an adjustment screw 7. The substrate wafer to be loaded and the susceptor segment come into contact shortly after the activation of the counterpressure cylinder 2 has been interrupted. To minimize the friction and associated vibrations, the stop 6 is moved over guide rolls 5.

Accordingly, while a few embodiments of the present invention have been shown and described, it is to be understood that many changes and modifications may be made thereunto without departing from the spirit and scope of the invention as defined in the appended claims.

What is claimed is:

1. A method for loading a heated susceptor or a susceptor segment of a deposition reactor with a substrate wafer comprising the steps of resting a substrate wafer on a holding means;

before contact between the substrate wafer and a susceptor or a susceptor segment reaching a holding position in which the substrate wafer and the susceptor or the susceptor segment are at a vertical distance spaced from one another; and after a residence time in this holding position the substrate wafer is only then brought into contact with the susceptor or the susceptor segment.

2. The method of claim 1, wherein the substrate wafer and the susceptor or the susceptor segment are at a distance of between 0.1 and 100 mm spaced from one another in the holding position.

3. The method of claim 1, wherein the residence time in the holding position is between 0.1 and 100 seconds.

4. A device for loading a susceptor or a susceptor segment of a deposition reactor with a substrate wafer comprising a substrate wafer;

a holding means (13) on which said wafer is resting and said holding means having a lifting cylinder (1), which lifts the susceptor (10) or the susceptor segment (11) via a lifting linkage (3), and a counterpressure cylinder (2), by means of which a holding position is set.

5. The device of claim 4, further comprising valve means (9) for setting speed of operation of counterpressure cylinder (2).

6. The device of claim 4, further comprising a timer which maintains the holding position between the susceptor (10) and the substrate wafer (12).

7. The device of claim 4, wherein the substrate wafer is made of semiconductor material.

8. The device of claim 7, wherein the semiconductor material is silicon.

9. The device of claim 7, wherein the semiconductor material is germanium.

10. The method of claim 1, wherein the substrate wafer is made of semiconductor material.

11. The method of claim 10, wherein the semiconductor material is silicon.

12. The method of claim 10, wherein the semiconductor material is germanium.

13. A method for loading a heated susceptor or a susceptor segment of a deposition reactor with a substrate wafer comprising the steps of resting a substrate wafer on a holding means;

said holding means (13) having a lifting cylinder (1), which lifts the susceptor (10) or the susceptor segment (11) via a lifting linkage (3), and a counterpressure cylinder (2), by means of which a holding position is set; and a timer which maintains the holding position between the susceptor (10) or the susceptor segment (11) and the substrate wafer (12); and before contact between the substrate wafer and the susceptor or the susceptor segment, reaching said holding position in which the substrate wafer and the susceptor or the susceptor segment are at a vertical distance spaced from one another; and after a residence time in this holding position by using said timer, the substrate wafer is only then brought into contact with the susceptor or the susceptor segment.

14. A device for loading a susceptor or a susceptor segment of a deposition reactor with a substrate wafer comprising a substrate wafer;

a holding means (13) on which said wafer is resting and said holding means having a lifting cylinder (1), which lifts the susceptor (10) or the susceptor segment (11) via a lifting linkage (3), and a counterpressure cylinder (2), by means of which a holding position is set; and a timer which maintains the holding position between the susceptor (10) or the susceptor segment (11) and the substrate wafer (12).

* * * * *